(12) United States Patent
Li

(10) Patent No.: US 10,319,611 B2
(45) Date of Patent: Jun. 11, 2019

(54) SEMICONDUCTOR DEVICE PACKAGE WITH WARPAGE PREVENTION

(71) Applicant: SAMSUNG ELECTRONICS CO., LTD., Suwon-si, Gyeonggi-Do (KR)

(72) Inventor: Yinan Li, Hwasung-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/786,676

(22) Filed: Oct. 18, 2017

(65) Prior Publication Data

US 2018/0269075 A1 Sep. 20, 2018

(30) Foreign Application Priority Data

Mar. 15, 2017 (CN) .......................... 2017 1 0153211

(51) Int. Cl.
*H01L 21/48* (2006.01)
*H01L 23/498* (2006.01)
(Continued)

(52) U.S. Cl.
CPC .......... *H01L 21/563* (2013.01); *H01L 21/486* (2013.01); *H01L 23/49816* (2013.01);
(Continued)

(58) Field of Classification Search
CPC ............. H01L 21/76898; H01L 23/481; H01L 2224/023; H01L 2224/024; H01L 25/0657
See application file for complete search history.

(56) References Cited

U.S. PATENT DOCUMENTS 8,258,007 B2 * 9/2012 Shen ................ H01L 21/76898
257/621
8,659,174 B2 2/2014 Miyata et al.
(Continued)

FOREIGN PATENT DOCUMENTS

CN 101276809 A 10/2008
CN 102254897 A 11/2011
(Continued)

OTHER PUBLICATIONS

Chinese Office Action dated Aug. 28, 2018 cited in corresponding Chinese Application No. 201710153211.2.
(Continued)

*Primary Examiner* — Allen L Parker
*Assistant Examiner* — Gustavo G Ramallo
(74) *Attorney, Agent, or Firm* — Volentine, Whitt & Francos, PLLC

(57) ABSTRACT

A semiconductor device package includes a substrate having a first surface and a second surface facing away from the first surface, a conductive column extending in the substrate between the first surface and the second surface, a dielectric layer on the first surface of the substrate, a redistribution structure provided in the dielectric layer and electrically connected to the conductive column, a semiconductor chip provided above the dielectric layer and electrically connected to the redistribution structure, and an encapsulation layer on the dielectric layer and encapsulating the semiconductor chip. The package is manufactured such that each of the substrate and the encapsulation layer is formed of molding compound.

15 Claims, 6 Drawing Sheets

(51) Int. Cl.
*H01L 21/56* (2006.01)
*H01L 23/00* (2006.01)
*H01L 23/538* (2006.01)
*H01L 23/31* (2006.01)

(52) U.S. Cl.
CPC .. *H01L 23/49822* (2013.01); *H01L 23/49827* (2013.01); *H01L 23/5389* (2013.01); *H01L 24/11* (2013.01); *H01L 24/19* (2013.01); H01L 23/3128 (2013.01); H01L 2224/12 (2013.01); H01L 2224/16225 (2013.01); H01L 2924/181 (2013.01)

(56) References Cited

U.S. PATENT DOCUMENTS

| | | | |
|---|---|---|---|
| 8,859,340 | B2 | 10/2014 | Gregorich et al. |
| 8,866,301 | B2 | 10/2014 | Lin et al. |
| 9,401,288 | B2 | 7/2016 | Haba et al. |
| 9,761,540 | B2 | 9/2017 | Shih |
| 2008/0237883 | A1 | 10/2008 | Tago et al. |
| 2008/0296735 | A1* | 12/2008 | Takehara ............ H01L 23/3114 257/621 |
| 2011/0285007 | A1* | 11/2011 | Chi ..................... H01L 21/4846 257/686 |
| 2012/0187545 | A1 | 7/2012 | Khan et al. |
| 2014/0377913 | A1 | 12/2014 | Gregorich |
| 2015/0069607 | A1 | 3/2015 | Hwang et al. |
| 2015/0171024 | A1* | 6/2015 | Choi ....................... H01L 24/97 257/774 |
| 2015/0303158 | A1 | 10/2015 | Huang et al. |
| 2016/0118311 | A1 | 4/2016 | Hu |
| 2016/0189980 | A1 | 6/2016 | Paek et al. |

FOREIGN PATENT DOCUMENTS

| | | |
|---|---|---|
| CN | 102768962 A | 11/2012 |
| CN | 106298683 A | 1/2017 |
| KR | 101323925 B1 | 10/2013 |

OTHER PUBLICATIONS

Second Chinese Office Action dated Dec. 12, 2018 cited in corresponding Chinese Application No. 1 201710153211.2.

* cited by examiner

SEMICONDUCTOR DEVICE PACKAGE WITH WARPAGE PREVENTION

PRIORITY STATEMENT

This application claims the benefit of priority under 35 U.S.C. § 119 based on Chinese Patent Application No. 201710153211.2 filed on Mar. 15, 2017 and the entire contents of which are hereby incorporated by reference in their entirety.

BACKGROUND

The inventive concept relates to the semiconductor device package technologies. In particular, the inventive concept relates to semiconductor device packages and to methods of fabricating the same.

With the rapid spread of electronic products such as mobile phones, tablet PCs and digital cameras, semiconductor device packages find themselves gaining in use. One example of a semiconductor device package is a Flip-Chip Ball Grid Array (FCBGA) semiconductor device package. Typical in such a package, an active surface of at least one semiconductor chip is electrically connected to one surface of a substrate via a plurality of conductive bumps. An underfill is provided between the semiconductor chip and the substrate so that the underfill encloses each of the conductive bumps and fills the spaces between the conductive bumps to protect the conductive bumps and support the semiconductor chip. Meanwhile, the other surface of the substrate is provided with a plurality of solder balls as input/output terminals of the package. Such design has become a mainstream packaging technology for electronic components nowadays, as it provides for a significantly compact package helping to meet industry demand for miniaturizing electronic products.

In this respect, semiconductor device packages have become thinner. Therefore, the diverse coefficients of thermal expansion (CTE) of various components in the semiconductor device package increase the likelihood that components will warp as the semiconductor device package is being fabricated. In the case that such warping of components occurs, an electronic connection between the substrate and the semiconductor device package or between the conductive bumps of the semiconductor chip and the substrate may fail. In addition, after soldering the conductive bumps to the substrate by a reflow process, warping induced by a shrinking of the substrate may also lead to cracking of the conductive bumps, which may impair the electrical connections and reduce the overall quality of the end product.

U.S. Published Patent Application No. 2015/0303158A1 discloses a semiconductor die package which can prevent warping and improve adhesion. As shown in FIG. 1, a conventional FCBGA semiconductor device package 12 includes a die 121, through package vias (TPVs) 122, molding compounds 123 and 128, a first redistribution structure 124, a second redistribution structure 125, solder balls 126 and connectors 127. The different CTEs between the components tend to cause upward warping at the edges of the semiconductor device package 12. As shown in FIG. 2, the semiconductor device package 12' disclosed in the U.S. patent publication uses a material 212 which can supply compressive stress to form a second redistribution structure 125 in order to balance thermally induced forces generated in the semiconductor device package 12'. FIG. 3 is an enlarged view of a rectangular portion P in FIG. 2. As shown in FIG. 3, a compressive stress layer 212 is provided as a bottom layer of the stacked second redistribution structure 125, and is disposed on the molding compound 123 and the TPV 122 while exposing a portion of the TPV 122. The passivation layer 214 is provided above the compressive stress layer 212. The second redistribution wiring 213 is buried in the compressive stress layer 212 and the passivation layer 214.

However, although such a design can reduce warping in the semiconductor device package, the warping can only be mitigated to a limited extent by the compressive stress layer provided in the redistribution structure due to a limited thickness of the redistribution structure in the semiconductor device package, and defects related to the warping produced by epoxy molding compound (EMC) cannot be sufficiently controlled.

SUMMARY

According to an aspect of the inventive concept, there is provided a semiconductor device package including a substrate having a first surface and a second surface facing away from the first surface, a conductive column extending in the substrate from the first surface to the second surface, a dielectric on the first surface of the substrate, a redistribution structure extending within the dielectric and electrically connected to the conductive column, a semiconductor chip on the dielectric and electrically connected to the redistribution structure, and an encapsulation layer on the dielectric and encapsulating the semiconductor chip, and in which each of the substrate and the encapsulation layer consists of molding compound.

According to another aspect of the inventive concept there is provided a method of fabricating a semiconductor device package, the method including providing a substrate having a first surface and a second surface facing away from the first surface, forming conductive columns in the substrate, forming a body of dielectric material and a redistribution structure on the first surface of the substrate, the redistribution structure extending within the dielectric material and electrically connected to the conductive columns, setting a semiconductor chip on the redistribution structure and electrically connecting the semiconductor chip to the redistribution structure, and forming an encapsulation layer on the body of dielectric material to encapsulate the semiconductor chip, and in which each of the substrate and the encapsulation layer is formed of molding compound.

According to an aspect of the inventive concept, there is also provided a semiconductor device package including a sandwich structure consisting of a body of dielectric material interposed between an upper layer of molding compound and a lower layer of molding compound. The lower layer of molding compound has first and second surfaces that face away from each other, the body of dielectric material is disposed directly on the first surface of the lower layer of molding compound, and the upper layer of molding compound is disposed directly on the body of dielectric material. The semiconductor device package also includes electrically conductive columns extending vertically through the lower layer of molding compound from the first surface to the second surface thereof, redistribution wiring extending within the dielectric and electrically connected to the conductive columns, and a semiconductor chip disposed on the body of dielectric material, encapsulated by the upper layer of molding compound, and electrically connected to the redistribution wiring.

According to another aspect of the inventive concept there is provided a method of fabricating a semiconductor device package, the method including forming electrically conductive columns in a first surface of a first layer of molding compound, subsequently forming an intermediate structure directly on the first surface of the layer of molding compound, the intermediate structure including at least one layer of dielectric material and redistribution wiring electrically connected to the electrically conductive columns, setting a semiconductor chip on the intermediate structure and electrically connecting the semiconductor chip to the redistribution wiring, and subsequently encapsulating the semiconductor chip by forming second layer of molding compound over the chip and directly on the at least one layer of dielectric material of the intermediate structure.

BRIEF DESCRIPTION OF THE DRAWINGS

Examples of the inventive concept will now be described in detail hereinafter with reference to the accompanying drawings. In the drawings, like reference characters designate like part. The drawings are not necessarily drawn to scale, but to emphasize the principles of the inventive concept.

DETAILED DESCRIPTION

Examples of the inventive concept will now be described in detail hereinafter with reference to the accompanying drawings, in which the shape of layers or regions may be exaggerated to clearly illustrate aspects of the inventive concept. The inventive concept is not limited to the following examples, however.

Figure 1:
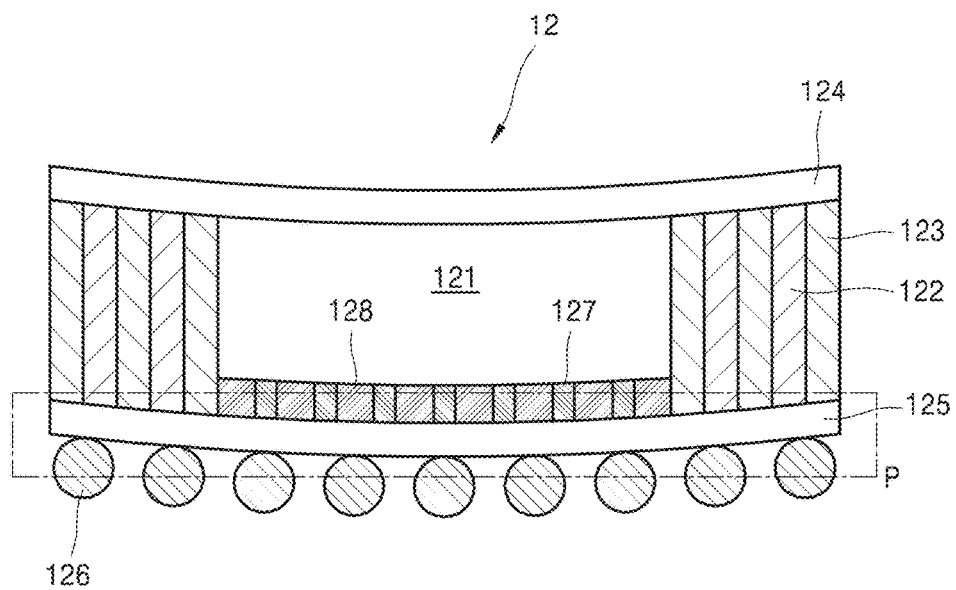
FIG. 1 is a cross-sectional view of a semiconductor device package according to the prior art.
Figure 2:
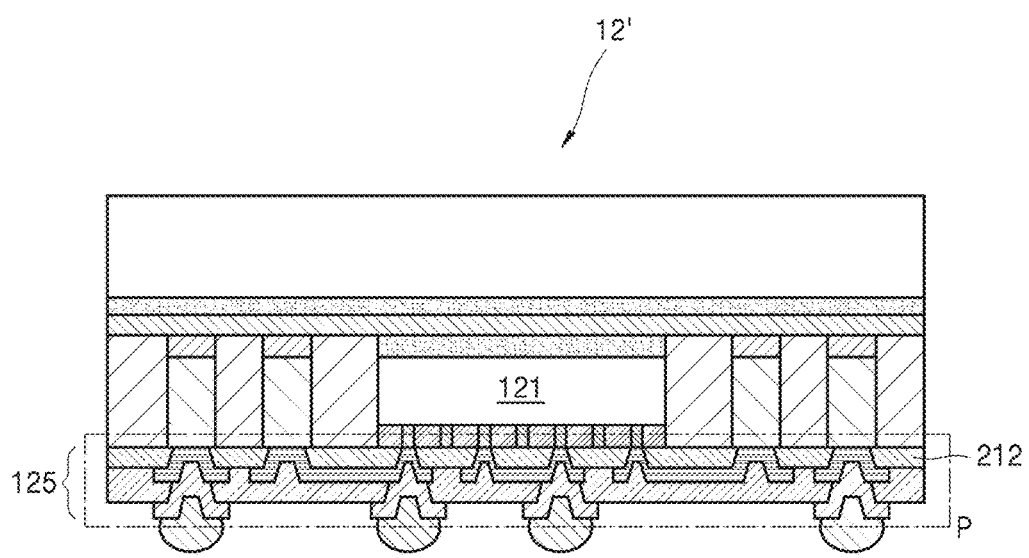
FIG. 2 is a cross-sectional view of another semiconductor device package according to the prior art.
Figure 3:
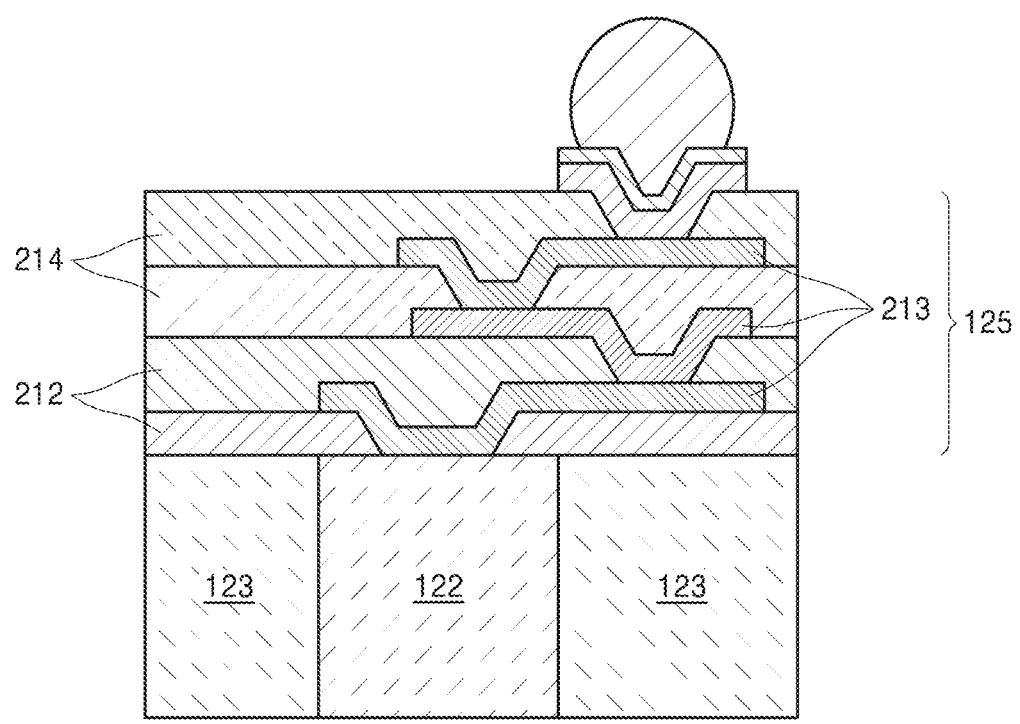
FIG. 3 is an enlarged view of a portion P in FIG. 2.
Figure 4:
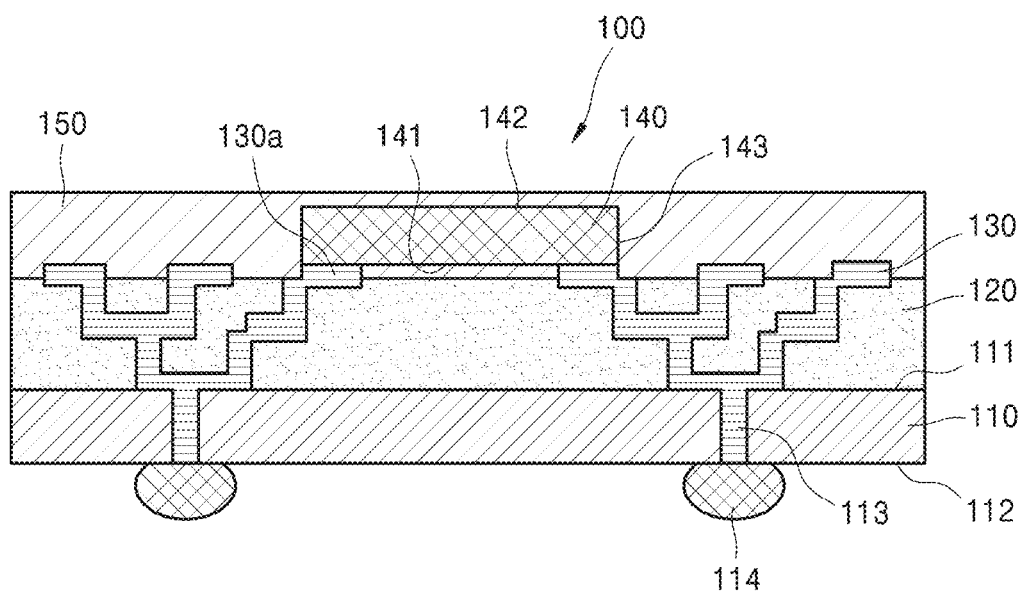
FIG. 4 is a cross-sectional view of an example of a semiconductor device package according to the inventive concept.

FIG. 4 shows an example of a semiconductor device package according to the inventive concept. As shown in FIG. 4, the semiconductor device package 100 includes a substrate 110, a dielectric layer 120, a redistribution structure 130, a semiconductor chip 140 and an encapsulation layer 150. The substrate 110 is formed of a molding compound. In one example, the substrate 110 consists of epoxy molding compound (EMC). The substrate 110 has a first surface 111 and a second surface 112 facing away from the first surface 111. In one example, the substrate 110 has the shape of a thin plate formed of the EMC. The first surface 111 can be a surface on which multiple layers of wiring structure are formed, and the second surface 112 can be a surface at which the package 100 is connected with an external circuit.

The semiconductor device package 100 also has a conductive column 113 extending vertically in the substrate 110. In one example, the conductive column 113 extends vertically to the second surface 112 from the first surface 111 of the substrate 110. In some examples, the conductive column 113 is formed of metal such as copper, but the inventive concept is not limited thereto as the conductive column can be formed of other conductive materials. When the semiconductor device package 100 is a three-dimensional semiconductor device package, the conductive column 113 can be a Through-Substrate-Via (TSV).

Also note, throughout the description a single feature such as the column 13 may be referred to for the sake of ease of description, although the example may have a plurality of such features as shown in the drawings.

The dielectric layer 120 is provided on the first surface 111 of the substrate 110. The redistribution structure 130 is provided in the dielectric layer 120 and electrically connected to the conductive column 113. Specifically, the redistribution structure 130 may extend on the first surface 111 of the substrate 110 in contact with the first surface 111. The dielectric layer 120 can be situated above the redistribution structure 130 and cover a portion of the redistribution structure 130, and a portion of the redistribution structure 130 which is not covered by the dielectric layer 120 can serve as a pad connected with the semiconductor chip or the external circuit. In some examples, the dielectric layer 120 includes at least one passivation layer or insulation layer. Specifically, the dielectric layer 120 can be formed of materials such as silicon oxide, silicon nitride, silicon oxynitride, or the like. In some examples, the redistribution structure can be formed of metal such as copper or an alloy of the metal, but the inventive concept is not limited thereto. Rather, the dielectric layer and the redistribution structure can be formed basically of any appropriate materials known in the semiconductor device packaging art.

In one example, the dielectric layer 120 is a stacked structure constituted by a plurality of layers. Thus, the dielectric "layer" 120 may be referred to simply as a body of dielectric material 120. The dielectric layer 120 and the redistribution structure 130 can together constitute an intermediate structure interposed or sandwiched directly between the substrate 110 and the encapsulation layer 150.

In particular, the redistribution structure 130 can contact the first surface 111 of the substrate 110, i.e., part of the redistribution structure 130 can be disposed directly on the first surface 111. The redistribution structure 130 can be buried in the dielectric layer 120 and has one portion (of "wiring") extending through the dielectric layer 120 so as to be electrically connected to the semiconductor chip on the dielectric layer 120 or the external circuit. The portion of the redistribution structure 130 constitutes a contiguous electrically conductive path from a first location at the bottom surface of the dielectric layer 120 to a second location at the top surface of the dielectric layer 120. The second location is offset relative to the first location in a direction parallel to the surfaces of the substrate 110. To this end, the portion of the redistribution structure 130 connected to the semiconductor chip 140 has a first part extending vertically into the dielectric 130 from the bottom surface thereof (shown just to the right above the left-most column 113 in the figure), a second part extending horizontally within the dielectric 130 between the bottom surface and the top surface of the dielectric 130, and a third part extending vertically in the dielectric 130 to the top surface of the dielectric (shown just below the left-most side of the semiconductor chip 140 in the figure). Here, the first part and the second part are offset relative to one another in the direction parallel to the first and second surfaces of the substrate 110 and are connected to one another by the second part. The redistribution structure 130 can include another portion 130a exposed outside the dielectric layer 120, e.g., can be provided on a top surface of the dielectric layer 120, and take the form of pads electrically connected to the semiconductor chip 140. Each pad is connected to the above-mentioned third part extending vertically in the dielectric 130 to the top surface of the dielectric 130. Therefore, as the term "redistribution" implies in the art and as FIG. 4 clearly shows, the redistribution structure 130 serves to redistribute the locations at which the semiconductor chip 140 can be electrically connected to an external device by, for example, allowing for the electrically conductive columns 113 to be situated laterally outwardly of the semiconductor chip 140.

The semiconductor chip 140 is provided above the dielectric layer 120 and electrically connected to the redistribution structure 130. In one example, the semiconductor chip 140 has an active surface 141 and a plurality of conductive bumps (not shown) provided on the active surface 141. The semiconductor chip 140 can be electrically connected to the redistribution structure 130 via the conductive bumps provided on the active surface 141. In one example, the conductive bumps of the semiconductor chip 140 are connected to the redistribution structure 130 provided on the top surface of the dielectric layer 120. That is, the semiconductor chip can be provided on the dielectric layer 120 in a flip-chip manner. The conductive bumps provided on the active surface 141 of the semiconductor chip 140 can be electrically connected with the portion 130a of the redistribution structure 130 which is exposed outside the dielectric layer 120 and serves as the pad. In one example, the plurality of conductive bumps can be formed of metal such as copper or an alloy of such metal, although the inventive concept is not limited thereto.

The encapsulation layer 150 is provided on the dielectric layer 120 and encapsulates the semiconductor chip 140. The encapsulation layer 150 is formed of a molding compound. The encapsulation layer 150 and the substrate 110 can be formed of the same molding compound. In one example, the encapsulation layer 150 can be formed of epoxy molding compound (EMC). In one example, in addition to the active surface 141, the semiconductor chip 140 can include an inactive surface 142 and side surfaces 143. The encapsulation layer 150 can surround the semiconductor chip 140 and cover the inactive surface 142 and the side surfaces 143. In this example, the encapsulation layer 150 also fills a space (referred to S of FIG. 6E) between the active surface 141 of the semiconductor chip 140 and the dielectric layer 120. The semiconductor device package according to the inventive concept fills the space S with the molding compound when forming the encapsulation layer 150, hence obviating the need for an underfill process.

In one example, the semiconductor device package 100 can further comprise a solder ball 114 provided on the second surface 112 of the substrate 110 and electrically connected to the conductive column 113. Specifically, the solder ball 114 can overlap the conductive column 113. The semiconductor chip 140 can be electrically connected to the solder ball 114 through the conductive bumps (not shown) provided on the active surface 141, the redistribution structure 130 provided in the dielectric layer 120 and the conductive column 113 provided in the substrate 110, so that data or signals received from external circuits or devices can be transmitted from the solder ball 114 to the semiconductor chip 140.

The diverse coefficients of thermal expansion (CTE) of different components in the semiconductor device package may increase the chance of warping when the semiconductor device package is fabricated. Such warping may create defects in electrical connections between the substrate and the semiconductor device package or between the conductive bumps of the semiconductor chip and the substrate. In addition, after the conductive bumps are attached to the substrate by a reflow soldering process, the warping induced by a shrinking of the substrate may also lead to cracking of the conductive bumps, thereby impairing the electrical connections and degrading the quality of the end product. Each of the substrate and the encapsulation layer of the semiconductor device package according to the inventive concept is formed of molding compound, thereby constituting a structure in which the dielectric layer is sandwiched between upper and lower or first and second layers of molding compound. Such a sandwich structure can counteract the stress produced during fabrication, and inhibit warping of the semiconductor device package.

Figure 5:
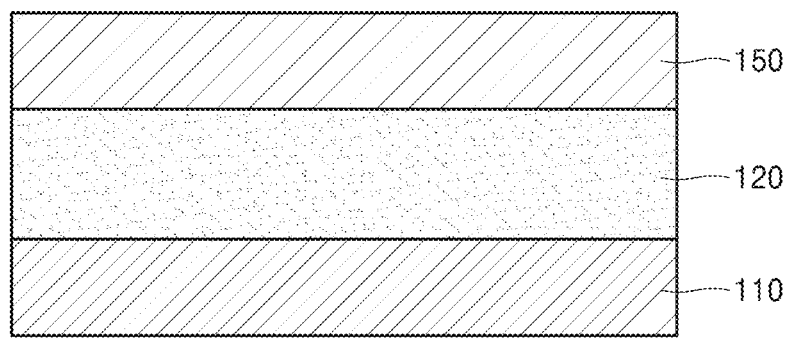
FIG. 5 is a cross-sectional view of a sandwich structure of the semiconductor device package according to the inventive concept.

FIG. 5 shows a sandwich structure of the semiconductor device package according to the inventive concept. In one example, a thickness of the encapsulation layer 150 and a thickness of the substrate 110 are such that the encapsulation layer 150 and substrate 110 cancel stress on one another to prevent warping. As shown in FIG. 5, the encapsulation layer 150 can be formed to substantially the same thickness as the substrate 110, and the dielectric layer 120 is sandwiched or interposed therebetween, so that the sandwich structure or structure of layers the semiconductor device package 100 is symmetrical. The encapsulation layer and the substrate are symmetrical to each other about a horizontal plane (plane parallel to the major surfaces of the layers) passing through the vertical center of the dielectric layer 120, Also, in this example, the encapsulation layer and the substrate are formed of the same material (i.e., the same molding compound) and have substantially the same thicknesses. The thicknesses are similar such that the stress induced in one of the encapsulation layer and the substrate during the fabrication process is counteracted by the stress induced in the other, whereby the stress is balanced and warping is prevented.

FIGS. 6A-6G show an example of a method of fabricating a semiconductor device package according to the inventive concept.

Figure 6A:
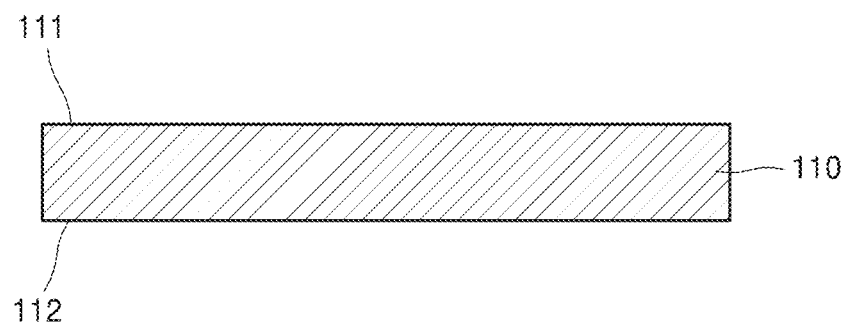
FIGS. 6A, 6B, 6C, 6D, 6E, 6F and 6G are cross-sectional views of a semiconductor device package during the course of its manufacture and show steps of an example of a method of fabricating a semiconductor device package according to the inventive concept.

First, as shown in FIG. 6A, the substrate 110 is prepared. The substrate 110 is formed of molding compound. In one example, the substrate 110 is formed of epoxy molding compound (EMC). The substrate 110 includes a first surface 111 and a second surface 112 facing away from the first surface 111.

Figure 6B:
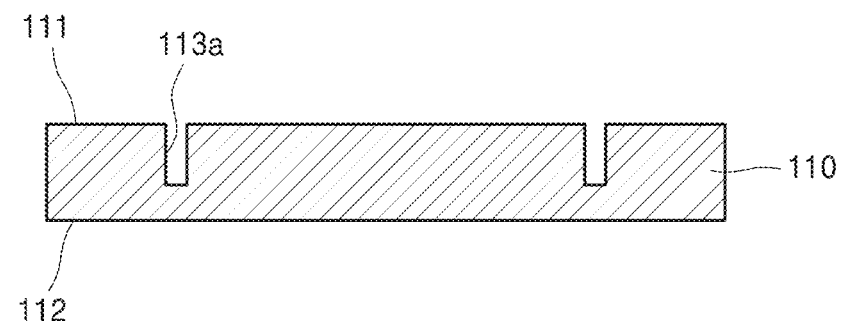

Next, as shown in FIG. 6B, the conductive column 113 is formed in the substrate 110. The conductive column 113 can be formed to from the first surface 111 of the substrate 110. In one example, holes 113a can be formed in the first surface 111 of the substrate 110 by a drilling process. Examples of the drilling process include laser drilling, machine drilling, chemical corrosion and ion etching, although the inventive concept is not limited to a particular type of drilling process. The holes 113a can have a depth smaller than the thickness of the substrate 110 so as to not penetrate the substrate 110. Subsequently, metal such as copper may be deposited on the substrate 110 to such a thickness as to fill the holes 113a. Then any metal on the first surface 111 of the substrate 110 is removed by a polishing process such as chemical mechanical polishing (CMP), so as to form the conductive columns 113 in the holes, respectively. In addition, the conductive columns 113 can completely fill the holes 113a.

As a result, the upper surface of the conductive columns 113 may be situated at the same level as the first surface 111 of the substrate 110.

Figure 6C:
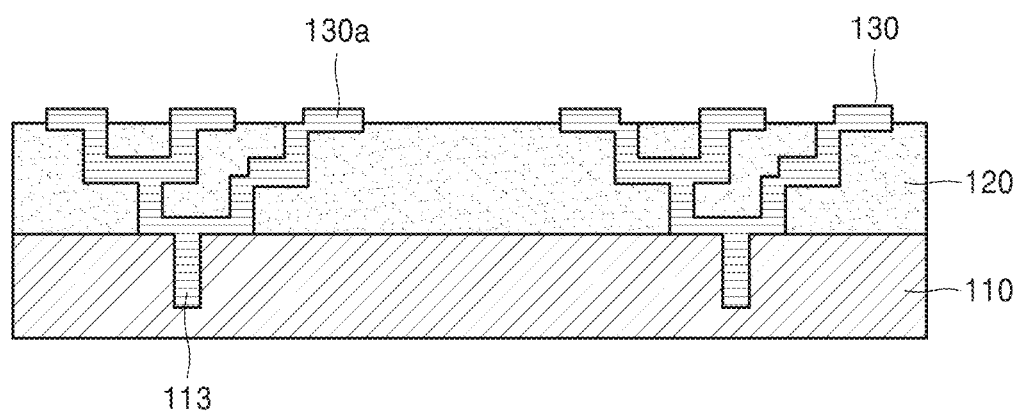

Next, as shown in FIG. 6C, the dielectric layer 120 and the redistribution structure 130 are formed on the first surface 111 of the substrate 110. In one example, firstly, the redistribution structure 130 is formed on the substrate 110, and then the dielectric layer 120 is formed on the redistribution structure 130 to cover the redistribution structure 130. Specifically, a mask can be used to form a redistribution pattern on the substrate 110 through exposure and development processes, then the redistribution structure 130 can be formed through a lithography process, and the dielectric layer 120 can be formed on the redistribution structure 130 by using chemical vapor deposition (CVD) process or spin coating process. In the end, the redistribution structure 130 is provided in the dielectric layer 120 and electrically connected to the conductive columns 113.

In one example, the dielectric layer 120 is formed to cover one portion of the redistribution structure 130, and the other portion 130a of the redistribution structure 130 is exposed at the outside the dielectric layer 120 to serve as pads.

Figure 6D:
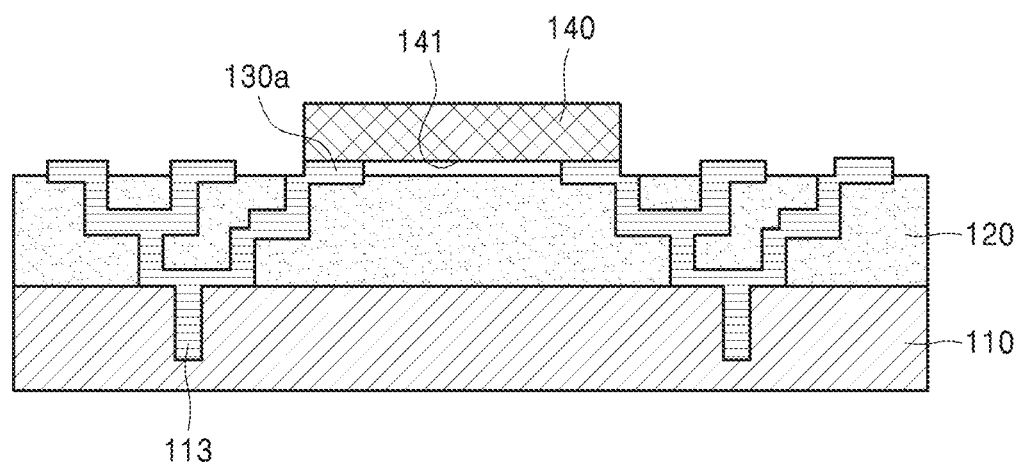

Next, as shown in FIG. 6D, the semiconductor chip 140 is provided on and electrically connected with the redistribution structure 130. In one example, the semiconductor chip 140 includes an active surface 141 and a plurality of conductive bumps on the active surface 141. In this case, the semiconductor chip 140 is electrically connected to the redistribution structure 130 via the conductive bumps provided on the active surface 141 of the semiconductor chip 140. Specifically, the conductive bumps of the semiconductor chip 140 are connected to the redistribution structure 130 provided on the top surface of the dielectric layer 120. That is, the conductive bumps may contact the portion 130a of the redistribution structure 130 which serves as pads so as to electrically connect the semiconductor chip 140 to the redistribution structure 130.

Figure 6E:
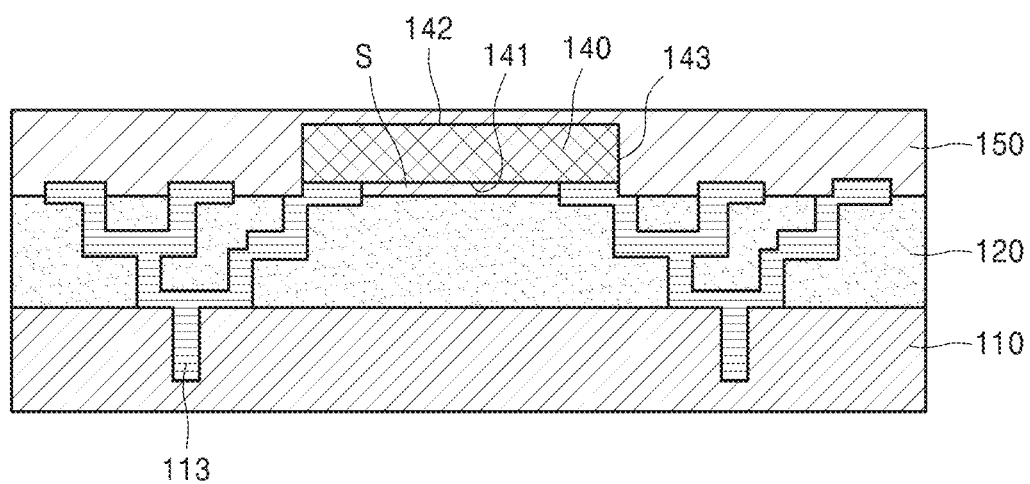

Next, as shown in FIG. 6E, the encapsulation layer 150 is formed on the dielectric layer 120 to encapsulate the semiconductor chip 140. The encapsulation layer 150 is formed of molding compound. In one example, the encapsulation layer 150 is formed of epoxy molding compound (EMC). The encapsulation layer 150 and the substrate 110 can be formed of the same molding compounds. A thickness of the encapsulation layer 150 and a thickness of the substrate 110 can be specified to cancel out stress therebetween to prevent warping. In one example, in addition to the active surface 141, the semiconductor chip 140 has an inactive surface 142 and side surfaces 143 covered by the encapsulation layer 150. In this example, when forming the encapsulation layer 150, a space S between the active surface 141 of the semiconductor chip 140 and the dielectric layer 120 can be filled by the molding compound. The method of fabricating a semiconductor device package according to the inventive concept provides for an efficient underfill process.

Figure 6F:
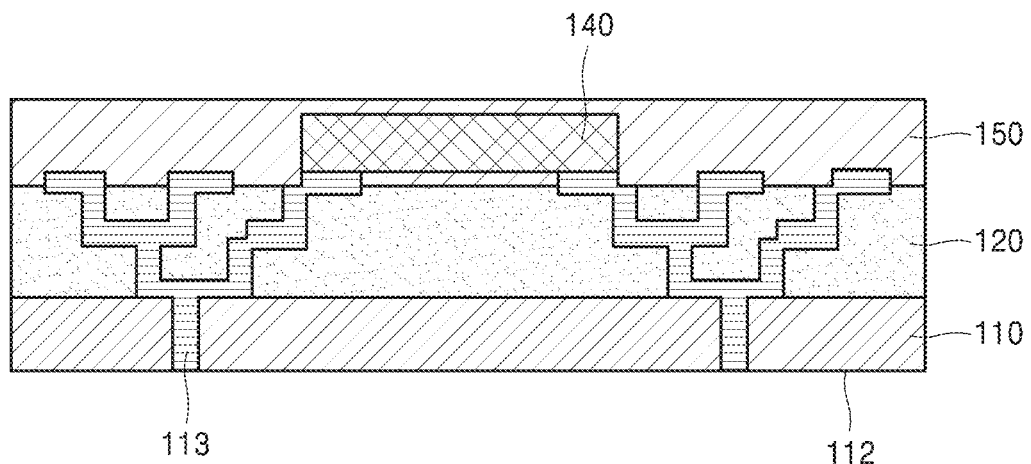

Next, as shown in FIG. 6F, a polishing process can be performed on the second surface 112 of the substrate 110 so as to reduce the thickness of the substrate 110 and expose the conductive columns 113. In one example, the polishing process can be at least one of a chemical mechanical polishing and abrasion polishing. The polishing process can be performed until the conductive columns 113 are barely exposed.

Figure 6G:
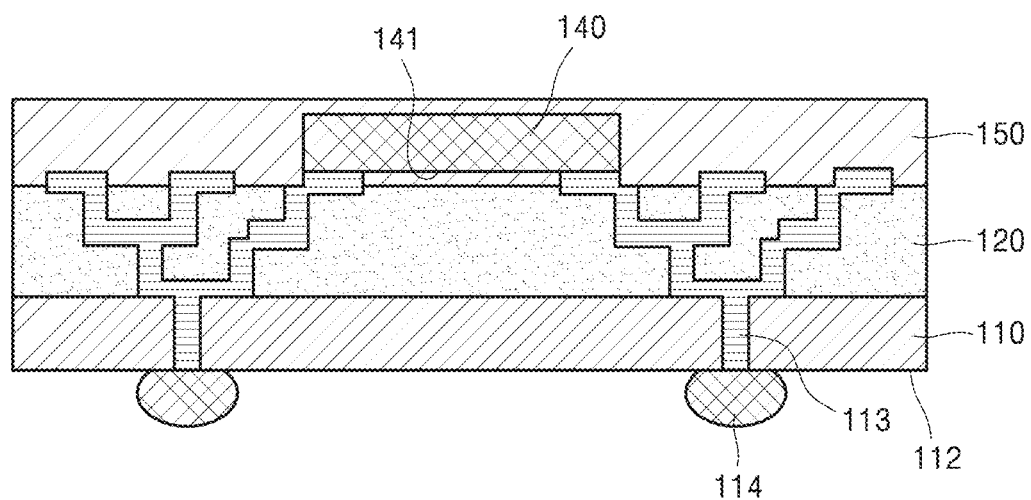

Next, as shown in FIG. 6G, the solder balls 114 are provided on the second surface 112 of the substrate 110 and electrically connected to the conductive columns 113. In one example, the solder balls 114 are formed to overlap the conductive columns 113, respectively. Thus, the semiconductor chip 140 can be electrically connected to the solder balls 114 through the conductive bumps (not shown) provided on the active surface 141, the redistribution structure 130 provided in the dielectric layer 120 and the conductive columns 113 provided in the substrate 110 so that data or signals received from external circuits or devices can be transmitted from the solder balls 114 to the semiconductor chip 140.

In a method of fabricating a semiconductor device package according to the inventive concept, a sandwich structure is used constituted by the substrate and the encapsulation layer, each of which is formed of molding compound, with the dielectric layer interposed therebetween. The above structure can be applied to a fan-out wafer level package (WLP) to effectively control the warping of the packages, and to solve the problem in conventional fan-out wafer level packaging technology of separation of the chips from a glass substrate. Thus, practicing the inventive concept may improve the yield of a semiconductor device package manufacturing process, and produce highly durable semiconductor device packages.

Although the present inventive concept has been shown and described with respect to various examples thereof, those skilled in the art will understand that the inventive concept is not limited to these examples. Rather, various changes may be made to the examples described therein without departing from the spirit and scope of the inventive concept as defined by the following claims.

What is claimed is:

1. A semiconductor device package, comprising:
a substrate having a first surface and a second surface facing away from the first surface;
a conductive column extending in the substrate from the first surface to the second surface of the substrate;
a dielectric on the first surface of the substrate, the dielectric having a top surface and a bottom surface, the bottom surface of the dielectric facing the first surface of the substrate;
a redistribution structure extending within the dielectric and electrically connected to the conductive column;
a semiconductor chip on the dielectric and electrically connected to the redistribution structure; and
an encapsulation layer on the dielectric and encapsulating the semiconductor chip,
wherein each of the substrate and the encapsulation layer consists of molding compound, and
a thickness of the substrate in a first direction perpendicular to the first surface of the substrate and a thickness of the encapsulation layer in the first direction are substantially same.

2. The semiconductor device package of claim 1, wherein the semiconductor chip has an active surface and conductive bumps on the active surface, and the semiconductor chip is electrically connected to the redistribution structure via the conductive bumps.

3. The semiconductor device package of claim 2, wherein the encapsulation layer fills a space between the active surface of the semiconductor chip and the dielectric.

4. The semiconductor device package of claim 2, wherein the redistribution structure has an upper portion extending along the top surface of the dielectric in a second direction parallel to the first surface of the substrate, and the conductive bumps of the semiconductor chip are connected to the upper portion of the redistribution structure.

5. The semiconductor device package of claim 1 further comprising a solder ball on the second surface of the substrate and electrically connected to the conductive column.

6. The semiconductor device package of claim 1, wherein the redistribution structure has a portion buried in the dielectric, said portion of the redistribution structure constituting a contiguous electrically conductive path extending within the dielectric from a first location at the bottom surface of the dielectric to a second location at the top surface of the dielectric, the second location being offset relative to the first location in a second direction parallel to the first surface of the substrate, and said portion of the redistribution structure being electrically connected to the conductive column at the first location.

7. The semiconductor device package of claim 6, wherein the conductive column is disposed laterally outwardly relative to the semiconductor chip.

8. The semiconductor device package of claim 6, wherein said portion of the redistribution structure has a first part extending vertically into the dielectric from the bottom surface thereof, a second part extending horizontally within the dielectric between the bottom surface and the top surface of the dielectric, and a third part extending vertically in the dielectric to the top surface of the dielectric, the first part and the third part being offset relative to one another in the second direction.

9. A semiconductor device package, comprising:
   a sandwich structure consisting of a body of dielectric material interposed between an upper layer of molding compound and a lower layer of molding compound, wherein the body of dielectric material has a top surface and a bottom surface, the lower layer of molding compound has first and second surfaces that face away from each other, the body of dielectric material is disposed directly on the first surface of the lower layer of molding compound with the bottom surface of the body of dielectric material facing the first surface of the lower layer of molding compound, and the upper layer of molding compound is disposed directly on the top surface of the body of dielectric material;
   electrically conductive columns extending vertically through the lower layer of molding compound from the first surface to the second surface thereof;
   redistribution wiring extending within the body of dielectric material and electrically connected to the conductive columns; and
   a semiconductor chip disposed on the top surface of the body of dielectric material, encapsulated by the upper layer of molding compound, and electrically connected to the redistribution wiring,
   wherein a thickness of lower layer of molding compound in a first direction perpendicular to the first surface of the lower layer of molding compound and a thickness of the upper layer of molding compound in the first direction are substantially same.

10. The semiconductor device package of claim 9, further comprising external terminals disposed directly on the second surface of the lower layer of molding compound and electrically connected to the electrically conductive columns.

11. The semiconductor device package of claim 9, wherein the upper layer of molding compound and the lower layer of molding compound are of the same materials as one another.

12. The semiconductor device package of claim 9, wherein the redistribution wiring includes pads of conductive material disposed on the body of dielectric material at the top surface thereof, the semiconductor chip has an active surface and conductive bumps on the active surface, the active surface faces the top surface of the body of dielectric material and the conductive bumps are disposed on the pads of conductive material of the redistribution wiring such that the active surface of the semiconductor chip is spaced from the body of dielectric material, and a portion of the upper layer of molding compound is filled between the active surface of the semiconductor chip and the top surface of the body of dielectric material.

13. The semiconductor device package of claim 9, wherein the redistribution wiring has portions buried in the body of dielectric material, each of said portions of the redistribution wiring constituting a contiguous electrically conductive path extending within the body of dielectric material from a first location at the bottom surface of the body of dielectric material to a second location at the top surface of the body of dielectric material, the second location being offset relative to the first location in a second direction parallel to the first surface of the lower layer of molding compound, and said portions of the redistribution wiring being electrically connected to the electrically conductive columns, respectively.

14. The semiconductor device package of claim 13, wherein the electrically conductive columns are all disposed laterally outwardly relative to the semiconductor chip.

15. The semiconductor device package of claim 13, wherein each of said portions of the redistribution wiring has a first part extending vertically into the body of dielectric material from the bottom surface thereof, a second part extending horizontally within the body of dielectric material between the bottom surface and the top surface of the body of dielectric material, and a third part extending vertically in the dielectric to the top surface of the body of dielectric material, the first part and the third part being offset relative to the first location in the second direction.

\* \* \* \* \*